(12) United States Patent
Park et al.

(10) Patent No.: US 8,319,420 B2
(45) Date of Patent: Nov. 27, 2012

(54) ORGANIC LIGHT EMITTING DIODE DISPLAY

(75) Inventors: Soon-Ryong Park, Suwon-si (KR); Il-Soo Park, Suwon-si (KR); Jun-Sik Oh, Suwon-si (KR); Dae-Yup Shin, Suwon-si (KR); Mu-Hyun Kim, Suwon-si (KR); Won-Jun Song, Suwon-si (KR); Seung-Wook Chang, Suwon-si (KR); Yeun-Joo Sung, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 204 days.

(21) Appl. No.: 12/076,755

(22) Filed: Mar. 21, 2008

(65) Prior Publication Data

US 2008/0231178 A1    Sep. 25, 2008

(30) Foreign Application Priority Data

Mar. 21, 2007    (KR) .................. 10-2007-0027755

(51) Int. Cl.
*H01L 51/50* (2006.01)

(52) U.S. Cl. .................... 313/504; 313/505; 313/506

(58) Field of Classification Search .......... 313/495–512; 315/169.3, 169.4
See application file for complete search history.

(56) References Cited

U.S. PATENT DOCUMENTS

| 5,776,622 | A | 7/1998 | Hung et al. | |
| 2005/0162074 | A1* | 7/2005 | Madathil et al. | 313/504 |
| 2005/0170209 | A1* | 8/2005 | Lee et al. | 428/690 |
| 2006/0251922 | A1* | 11/2006 | Liao et al. | 428/690 |
| 2006/0251924 | A1* | 11/2006 | Lu et al. | 428/690 |

FOREIGN PATENT DOCUMENTS

JP    06-314594    11/1994

* cited by examiner

*Primary Examiner* — Anh Mai
*Assistant Examiner* — Elmito Breval
(74) *Attorney, Agent, or Firm* — Lee & Morse, P.C.

(57) ABSTRACT

An organic light emitting diode (OLED) may include a first electrode, a hole injection layer on the first electrode, an emission layer on the hole injection layer, an electron injection layer on the emission layer, and a second electrode on the electron injection layer, wherein an absolute value of a difference between a work function of the first electrode and a work function of the second electrode is less than 0.5 eV, and at least one of the hole injection layer and the electron injection layer is a multilayer.

10 Claims, 9 Drawing Sheets

ORGANIC LIGHT EMITTING DIODE DISPLAY

BACKGROUND OF THE INVENTION

1. Field of the Invention

Embodiments relate to a pixel and an organic light emitting diode display including such a pixel. More particularly, embodiments relate to an organic light emitting diode (OLED) and a pixel employing such an OLED that may control a work function of a first electrode and a second electrode, and an organic light emitting display including such a pixel and/or OLED.

2. Description of the Related Art

Conventional OLEDs generally employ a first electrode having a first work function and a second electrode having a second work function, where the first and second work functions are different, i.e., have a difference of at least 0.5 eV, and result in a built-in potential. In order to drive such an OLED in an organic light emitting diode display including such an OLED, a driving voltage greater than the built-in potential need be applied. Therefore, an efficiency of such an OLED may be reduced. A need, therefore, exists for OLEDs having improved efficiency and capable of being driven at a relatively lower driving voltage.

SUMMARY OF THE INVENTION

Embodiments are directed to OLEDs, pixels and organic light emitting diode displays, which substantially overcome one or more of the problems due to the limitations and disadvantages of the related art.

It is therefore a feature of an embodiment of the invention to provide an OLED, a pixel including such an OLED and organic an organic light emitting diode display including such a pixel and/or OLED in which a work function of a first electrode and a second electrode may be adjusted in order to reduce a drive voltage and emission efficiency of the OLED and/or pixel.

At least one of the above and other features and advantages of the invention may be realized by providing an organic light emitting diode display, including at least one organic light emitting diode (OLED) including a first electrode, a hole injection layer on the first electrode, an emission layer on the hole injection layer, an electron injection layer on the emission layer, and a second electrode on the electron injection layer, wherein an absolute value of a difference between a work function of the first electrode and a work function of the second electrode is less than 0.5 eV, and at least one of the hole injection layer and the electron injection layer is a multilayer.

The work function of the first electrode and the work function of the second electrode may have a same value. The hole injection layer may be a multilayer. The multilayer hole injection layer may include a first hole injection layer, a second hole injection layer, and a third hole injection layer and an energy level of the second hole injection layer may be less than an energy level of the third hole injection layer, and an energy level of the first hole injection layer may be less than the energy level of the second hole injection layer, wherein the first hole injection layer may be closest to the second electrode and the third hole injection layer may be furthest from the second electrode.

The hole injection layer may have a HOMO (Highest Occupied Molecular Orbital) energy level between a HOMO energy level of the first electrode and a HOMO energy level of the emission layer. The electron injection layer may be a multilayer.

The electron injection layer may have an LUMO (Lowest Unoccupied Molecular Orbital) energy level between an LUMO energy level of the second electrode and an LUMO energy level of emission layer.

The multilayer electron injection layer may include a first electron injection layer, a second electron injection layer, and a third electron injection layer and an energy level of the second electron injection layer is less than an energy level of the third electron injection layer, and an energy level of the first electron injection layer is less than the energy level of the second electron injection layer, wherein the first electron injection layer is farthest from the second electrode and the third electron injection layer is closest to the second electrode.

The hole injection layer may be a multilayer and the electron injection layer may be a multilayer.

The hole injection layer may have a HOMO energy level between a HOMO energy level of the first electrode and a HOMO energy level of the emission layer, and the electron injection layer may have an LUMO energy level between an LUMO energy level of the second electrode and an LUMO energy level of the emission layer.

The display may further include a hole transport layer formed between the first electrode and the hole injection layer. The display may further include an electron transport layer formed between the second electrode and the electron injection layer.

The first electrode and the second electrode may include a same material. The first electrode and the second electrode may consist of a same material.

At least one of the above and other features and advantages of the invention may be separately realized by providing an organic light emitting diode (OLED), comprising a first electrode, a hole injection layer on the first electrode, an emission layer on the hole injection layer, an electron injection layer on the emission layer; and a second electrode on the electron injection layer, wherein an absolute value of a difference between a work function of the first electrode and a work function of the second electrode is less than 0.5 eV, and at least one of the hole injection layer and the electron injection layer is a multilayer.

The hole injection layer may be a multilayer. The multilayer hole injection layer may include a first hole injection layer, a second hole injection layer, and a third hole injection layer and an energy level of the second hole injection layer may be less than an energy level of the third hole injection layer, and an energy level of the first hole injection layer may be less than the energy level of the second hole injection layer, wherein the first hole injection layer may be closest to the second electrode and the third hole injection layer may be furthest from the second electrode.

The electron injection layer may be a multilayer. The multilayer electron injection layer may include a first electron injection layer, a second electron injection layer, and a third electron injection layer and an energy level of the second electron injection layer may be less than an energy level of the third electron injection layer, and an energy level of the first electron injection layer may be less than the energy level of the second electron injection layer, wherein the first electron injection layer may be farthest from the second electrode and the third electron injection layer may be closest to the second electrode.

The hole injection layer may have a HOMO (Highest Occupied Molecular Orbital) energy level between a HOMO energy level of the first electrode and a HOMO energy level of the emission layer, and the electron injection layer may have an LUMO (Lowest Unoccupied Molecular Orbital) energy level between an LUMO energy level of the second electrode and an LUMO energy level of emission layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
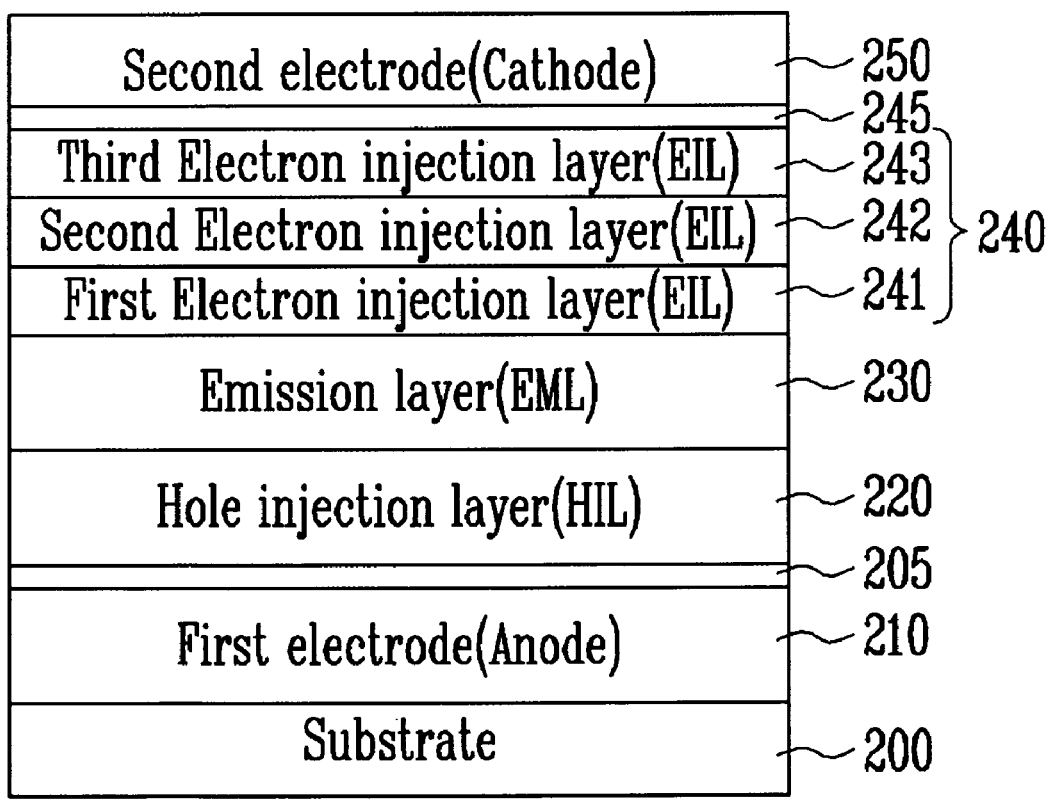
FIG. 1 illustrates a cross-sectional view of an OLED according to a first exemplary embodiment.

Korean Patent Application No. 10-2007-0027755, filed on Mar. 21, 2007, in the Korean Intellectual Property Office, and entitled: "Organic Light Emitting Diode Display," is incorporated by reference herein in its entirety.

Exemplary embodiments including one or more features of the invention will now be described more fully hereinafter with reference to the accompanying drawings; however, the features may be embodied in different forms and/or in different combinations and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only layer between the two elements, or one or more intervening elements may also be present. Further, it will be understood that when an element is referred to as being "coupled" or "connected" to another element, the element may be directly coupled or connected, or the element may be indirectly coupled or connected via one or more intervening elements. In the following description, the focus is on features of the invention and a description of known and/or irrelevant elements may be omitted for clarity. Like reference numerals refer to like elements throughout the specification.

FIG. 1 illustrates a cross-sectional view of an OLED 20 according to a first exemplary embodiment.

With reference to FIG. 1, the OLED 20 may include a first electrode (anode) 210, a hole injection layer (HIL) 220, an emission layer (EML) 230, an electron injection layer (EIL) 240, and a second electrode (cathode) 250. The first electrode 210 may be formed on a substrate 200 on which a thin film transistor is formed and may be electrically connected to the thin film transistor. The hole injection layer 220 may be formed on the first electrode 210. The emission layer 230 may be formed on the hole injection layer 220. The electron injection layer 240 may be formed on the emission layer 230. The second electrode 250 may be formed on the electron injection layer 240.

In some embodiments, a hole transport layer 205 for increasing a mobility degree of holes may be formed between the first electrode 210 and the hole injection layer 220. In some embodiments, an electron transport layer 245 for increasing a mobility degree of electrons may be formed between the second electrode 250 and the electron injection layer 240.

The first electrode 210 may be an electrode for supplying holes. The first electrode 210 may be a transparent electrode or a reflective electrode. In some embodiments in which the first electrode 210 is a transparent electrode, the first electrode 210 may include, e.g., indium tin oxide (ITO), indium zinc oxide (IZO), ZnO, or $In_2O_3$. In some embodiments in which the first electrode 210 is a reflective electrode, the first electrode 210 may include a layer including, e.g., Ag, Mg, Al, Pt, Pd, Au, Ni, Nd, Ir, Cr, or a compound thereof with, e.g., an ITO, IZO, ZnO, or $In_2O_3$ layer formed thereon.

The hole injection layer 220 may transport holes generated by the first electrode 210. The hole injection layer 220 may prevent electrons generated by the second electrode 250 from being moved to the first electrode 210.

The emission layer 230 may combine the holes and electrons injected from the first electrode 210 and the second electrode 250 to generate an exciton(s). When the exciton(s) change from an excited state to a ground state, the exiton(s) may emit light.

In some embodiments, a work function of the second electrode 250 may be the same as a work function of the first electrode 210. In some other embodiments, the first electrode 210 and the second electrode 250 may have a similar work function, e.g., a built-in potential difference of less than 0.5 eV. That is, in some embodiments, a built-in potential Vbi generated due to a difference between the work function of the first and second electrodes 210 and 250 may be structurally eliminated and/or minimized. In order to provide the first electrode 210 and the second electrode 250 having a same or similar work function, the first electrode 210 and the second electrode 250 may include a same material or a material having a similar work function. That is, in some embodiments, the first electrode 210 and the second electrode 250 may be formed of a same material.

The work function of the first electrode 210 corresponds to a difference between a vacuum level Es and a Fermi level of the first electrode 210. The work function of the second electrode 250 corresponds to a difference between the vacuum level Es and a Fermi level of the second electrode 250.

The built-in potential Vbi may be obtained by the following Equation 1:

$$Vbi = |\Phi an - \Phi ca| \quad \text{[Equation 1]}$$

where, Vbi is a built-in potential, Φan is a work function of the first electrode 210, and Φca is a work function of the second electrode 250.

The built-in potential Vbi may correspond to an energy barrier, which may correspond to a difference between the work function of the cathode, e.g., second electrode 250, and the anode, e.g., first electrode 210.

When there is a built-in potential due to a difference between work function of the first and second electrodes 210 and 250, a driving power may be consumed corresponding to an energy level of the built-in potential. That is, to drive the OLED 20, when a voltage greater than the energy level of the built-in potential is applied, electrons provided from the second electrode 250 may be moved to the emission layer 230.

Accordingly, as discussed above, in some embodiments, in order to eliminate and/or reduce the built-in potential, the first electrode 210 and the second electrode 250 may be formed to have the same or similar work function.

In general, a driving voltage greater than a built-in potential between a first electrode and a second electrode of an OLED need be applied in order to move electrons from the second electrode to an emission layer thereof. For example, to drive an OLED in which a difference between a work function of a first electrode and a second electrode is about 0.6 eV, a voltage greater than a built-in potential of about 0.6 eV need be applied in order move electrons from the second electrode the emission layer thereof.

In embodiments of the invention, by employing first and second electrodes 210 and 250 having a same or similar work function, e.g., a difference of less than 0.5 eV, a relatively lower driving voltage may be employed to drive the OLED 20. More particularly, e.g., in contrast to OLEDs including first and second electrodes having a built in potential of greater than 0.5 eV, embodiments of the invention may employ a relatively lower driving voltage in order to drive the OLED 20.

More particularly, in embodiments of the invention, a built-in potential generated due to a difference between work function of the first electrode 210 and the second electrode 250 may be reduced and/or eliminated in order to reduce an amount of power that may be employed for driving the OLED 20. Thus, some embodiments may provide an emission layer 230 of the OLED 20 having improved emission efficiency.

In some embodiments, the electron injection layer 240 adjacent to the second electrode 250 may be a multilayer. More particularly, the electron injection layer 240 may have such a multilayer structure that may gradually increase a difference between lowest unoccupied molecular orbital (LUMO) energy levels of the second electrode 250 and the emission layer 230. As a result, a transport performance of electrons may improve and a driving voltage of the OLED 20 may be reduced.

In some embodiments in which the first and second electrodes 210, 250 have a same or similar work function, by providing an electron injection layer 240 having a multilayer structure, an energy barrier between the second electrode 250 and a layer of the multilayer electron injection layer 240 closest to the second electrode layer 250 may be reduced while an energy barrier between the second electrode layer 250 and a layer of the multilayer electron injection layer 240 farthest from the second electrode layer 250 may be gradually increased via the respective layers of the multilayer electron injection layer 240.

More particularly, in some embodiments, the electron injection layer 240 may include a first electron injection layer 241, a second electron injection layer 242, and a third electron injection layer 243.

An LUMO energy level of the third electron injection layer 243 closest to the second electrode 250 may be lower than that of the second electrode 250, an LUMO energy level of the second electron injection layer 242 between the third electron injection layer 243 and the first electron injection layer 241 may be lower than that of the third electron injection layer 243, and an LUMO energy level of the first electron injection layer 241 farthest from the second electrode 250 may be lower than that of the second electron injection layer 242. Accordingly, some embodiments of the invention may enable electrons injected from the second electrode 250 to be relatively easily moved to the emission layer 230 at a relatively low voltage through the electron injection layer 240 having a multilayer structure.

For example, in a case in which a work function of the second electrode 250 is 3.7 eV and an LUMO of the emission layer 230 is 2.0 eV, the first electron injection layer 241 of the electron injection 240 may have an energy level of 2.2 eV, the second electron injection layer 242 may have an energy level of 2.7 eV, and the third electron injection layer 243 may have an energy level of 3.2 eV.

The electron injection layer 240 may aid in the transport of electrons generated from the second electrode 250, and may prevent holes from the first electrode 210 from being moved to the second electrode 250. That is, electrons from the second electrode 250 may be injected, and the electron injection layer 240 may aid the injected electrons to be smoothly moved to the emission layer 230, and may prevent holes from being moved to the second electrode 250.

As mentioned above, as the electron injection layer 240 may be formed in a multilayer structure, by reducing an energy barrier of the layer, e.g., the third electron injection layer 243, of the multilayer structure closest to the second electrode 250 and gradually increasing the energy barrier from the closest electron injection layer, e.g., the third electron injection layer 243, to the farthest electron injection layer, e.g., the first electron injection layer 241, from the second electrode 250, the electrons injected from the second electrode 250 may be gradually moved to the emission layer 230 through the respective layers of the multilayer electron injection layer 240.

Figure 2A:
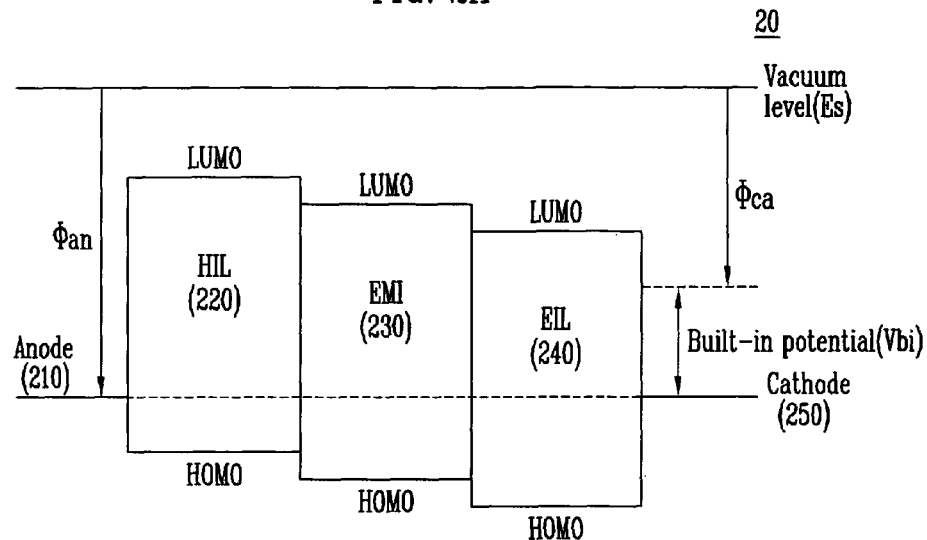
FIG. 2A and FIG. 2B illustrate energy diagrams of the OLED of FIG. 1.
Figure 2B:
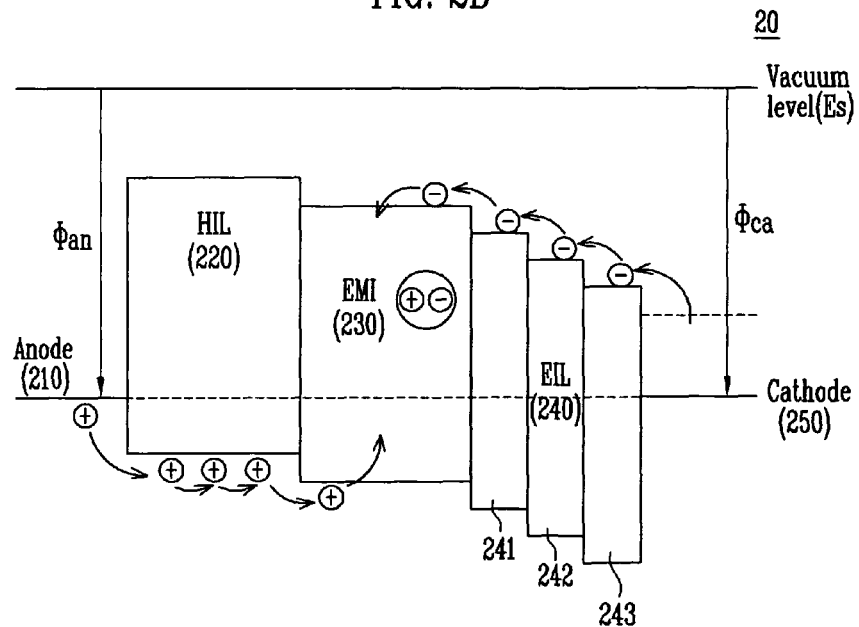

FIG. 2A and FIG. 2B illustrate energy diagrams of the OLED 20 of FIG. 1.

Electrons and holes are indicated as "−" and "+", respectively. Φan and Φca indicate work functions of the first electrode and the second electrode, respectively. HOMO and LUMO correspond to Highest Occupied Molecular Orbital and Lowest Unoccupied Molecular Orbital, respectively.

Referring to FIG. 2A and FIG. 2B, in the OLED 20, when a voltage is applied to the first electrode (anode) 210 and the second electrode (cathode) 250, holes and electrons from the first electrode 210 and the second electrode 250 may be injected into the emission layer (EML) 230, and light may be generated.

The work function of the second electrode 250 may have a same value as that of the first electrode 210, or the work function of the second electrode 250 may have a different value than that of the first electrode 210. In some embodiments, as discussed above, a work function of the second electrode 250 may have a same or similar value, e.g., less than 0.5 eV, as that of the first electrode 210, and a built-in potential generated due to a difference between the work function of the first and second electrodes 210 and 250 may be reduced and/or eliminated.

Furthermore, as the electron injection layer (EIL) 240 interposed between the emission layer 230 and the second electrode 250 may be a multilayer structure including the first electron injection layer 241, the second electron injection layer 242, and the third electron injection layer 243, an LUMO level may be gradually reduced from the second electrode 250 to the emission layer 230. Accordingly, the electrons injected from the second electrode 250 may be easily moved to the emission layer 230.

Accordingly, by forming the electron injection layer 240 as a multilayer, in some embodiments in which the second electrode 250 has a same or similar work function as that of the first electrode 210, a built-in potential Vbi between the second electrode 250 and the electron injection layer 240 may be compensated. As explained above, the electron injection layer 240 may be formed with a multilayer to reduce an energy barrier, namely, the built-in potential Vbi occurring between the second electrode 250 and the third electron injection layer 243, which may lead to a reduction in power consumption of the OLED 20.

Figure 3A:
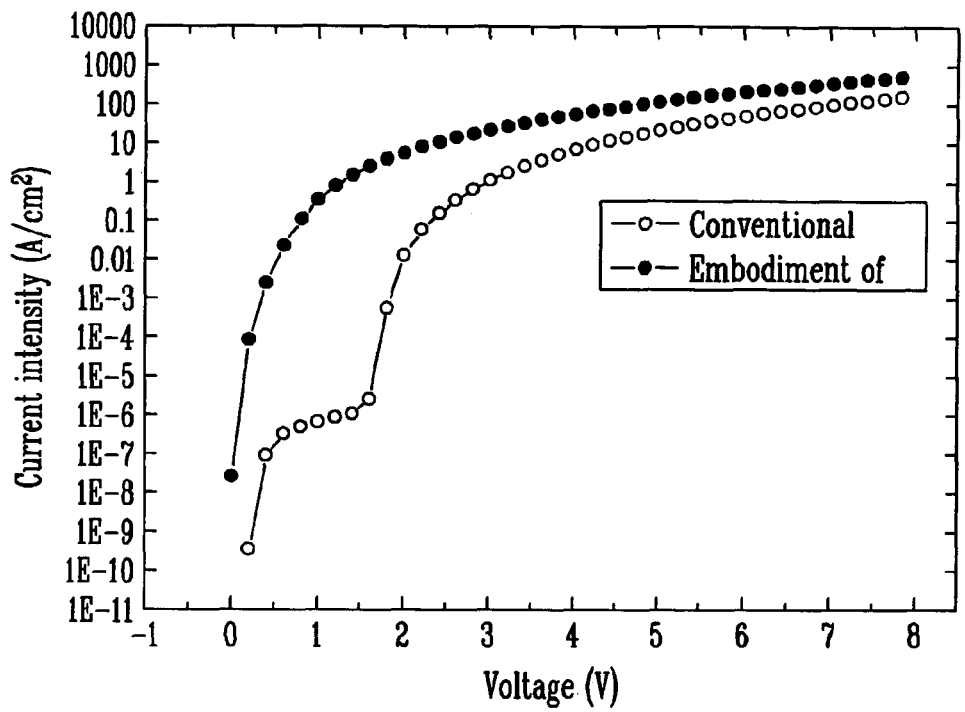
FIG. 3A illustrates a graph of a relationship between current intensity and voltage of the OLED of FIG. 1.
Figure 3B:
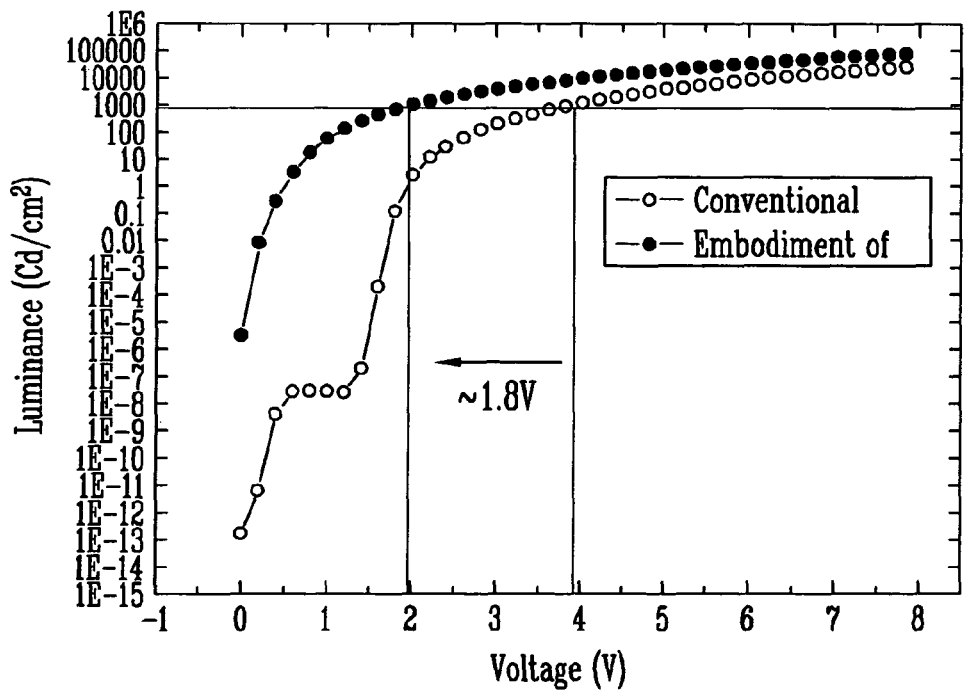
FIG. 3B illustrates a graph of a relationship between luminance and voltage of the OLED of FIG. 1.

FIG. 3A illustrates a graph of a relationship between current intensity and voltage of the OLED 20 of FIG. 1. FIG. 3B illustrates a graph of a relationship between luminance and voltage of the OLED 20 of FIG. 1. In the graphs of FIGS. 3A and 3B, the conventional case corresponds to a conventional OLED including first and second electrodes that have different work functions and/or does not include an electron injection layer having a multilayer structure.

Referring to FIG. 3A and FIG. 3B, an X axis of a graph of FIG. 3A indicates a voltage (V) and an Y axis thereof indicates a current intensity (J:A/cm$^2$). Further, an X axis of a graph of FIG. 3B indicates a voltage (V) and an Y axis thereof indicates luminance (L: cd/m$^2$).

Referring to FIG. 3A and FIG. 3B, in a conventional OLED, a built-in potential is about 2.04 V, while a built-in potential according to an embodiment of the present invention is about 0.14 V.

Referring to the graph illustrated in FIG. 3A, a current intensity of 1 E-5.5 (A/cm$^2$) may be obtained by the conventional OLED when a voltage of about 1.6 V is applied, whereas a current intensity of 1 E-5.5 (A/cm$^2$) may be obtained in the exemplary OLED 20 when a voltage of about 0.1 V is applied. According to the graph of FIG. 3B, a luminance of about 800 (cd/cm$^2$) may be obtained by the conventional OLED when a voltage of about 3.8 V is applied, whereas a luminance of about 800 (cd/cm$^2$) may be obtained by the exemplary OLED 20 when a voltage of about 2.0 V is applied.

Thus, as shown in FIG. 3A, the exemplary OLED 20 according to an embodiment of the invention may have a lower driving voltage, i.e., reduced by about 1.5 V, relative to the conventional OLED in order to obtain a current intensity of about 1 E-5.5 (A/cm$^2$). Further, as shown in FIG. 3B, the exemplary OLED 20 according to an embodiment may have a lower driving voltage, i.e., reduced by about 1.8 V, relative to the conventional OLED in order to obtain a luminance of about 800 (cd/cm$^2$).

Accordingly, under same or similar conditions, e.g., same voltage applied thereto, embodiments of the invention may provide an OLED having improved current intensity and/or luminance relative to a conventional OLED.

Figure 4:
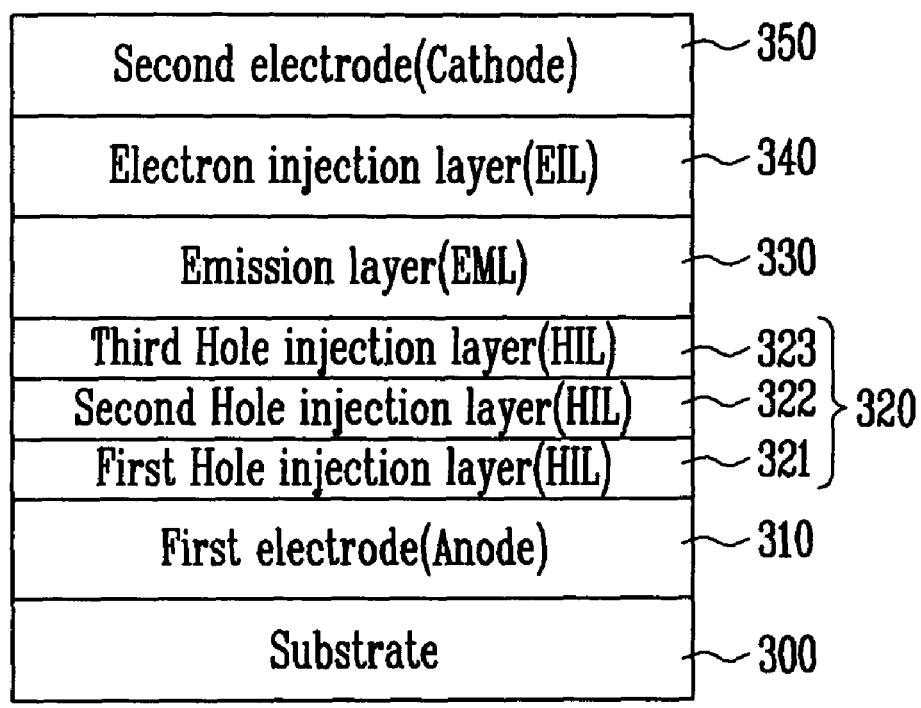
FIG. 4 illustrates a cross-sectional view of an OLED according to a second exemplary embodiment.

FIG. 4 illustrates a cross-sectional view of an OLED 30 according to a second exemplary embodiment. In general, only differences between the exemplary OLED 30 of FIG. 4 and the exemplary OLED 20 of FIG. 1 will be described below.

With reference to FIG. 4, the OLED 30 may include a first electrode (anode) 310, a hole injection layer (HIL) 320, an emission layer (EML) 330, an electron injection layer (EIL) 340, and a second electrode (cathode) 350. The first electrode 310 may be formed on a substrate 300 on which a thin film transistor is formed and may be electrically connected to the thin film transistor. The hole injection layer 320 may be formed on the first electrode 310. The emission layer 330 may be formed on the hole injection layer 320. The electron injection layer 340 may be formed on the emission layer 330. The second electrode 350 may be formed on the electron injection layer 340.

In some embodiments, a hole transport layer (not shown) for increasing a mobility degree of holes may be formed between the first electrode 310 and the hole injection layer 320. In some embodiments, an electron transport layer (not shown) for increasing a mobility degree of electrons may be formed between the second electrode 350 and the electron injection layer 340.

In some embodiments of the invention, in order to eliminate and/or reduce the built-in potential, the first electrode 310 and the second electrode 350 may be formed to have the same or similar work function. More particularly, in some embodiments, the built-in potential generated due to a difference between work function of the first electrode 310 and the second electrode 350 may be reduced and/or eliminated in order to reduce power consumption for driving the OLED 30, with the result that an emission layer 330 having improved emission efficiency may be provided.

In some embodiments, the hole injection layer 320 adjacent to the first electrode 310 may be a multilayer. More particularly, the hole injection layer 320 may have such a multilayer structure that may gradually increase a difference between LUMO energy levels of the first electrode 310 and the emission layer 330. As a result, a transport performance of electrons may improve and a driving voltage of the OLED 30 may be reduced.

In some embodiments in which the first and second electrodes 310, 350 have a same or similar work function, by providing a hole injection layer 320 having a multilayer structure, an energy barrier between the first electrode 310 and a layer of the multilayer hole injection layer 320 closest to the first electrode 310 may be reduced while an energy barrier between the first electrode 310 and a layer of the multilayer hole injection layer 320 farthest from the first electrode 310 may be gradually increased via the respective layers of the multilayer hole injection layer 320.

More particularly, in some embodiments, the hole injection layer 320 may include a first hole injection layer 321, a second hole injection layer 322, and a third hole injection layer 323.

In some embodiments, an HOMO energy level of the first electron injection layer 321 closest to the first electrode 310 may be higher than that of the second electrode 350, an HOMO energy level of the second hole injection layer 322 between the first hole injection layer 321 and the third hole injection layer 323 may be higher than that of the first hole injection layer 321, and an HOMO energy level of the third hole injection layer 323 farthest from the second hole injection layer 322 may be higher than that of the second hole injection layer 322. Accordingly, some embodiments of the invention may enable holes injected from the first electrode 310 to be easily moved to the emission layer 330 at a relatively low voltage through the hole injection layer 320 having a multilayer structure.

For example, in a case in which a work function of the first electrode 310 is 3.7 eV and an HOMO of the emission layer 330 is 2.0 eV, the first hole injection layer 321 of the hole injection 320 may have an energy level of 4.0 eV, the second hole injection layer 322 thereof may have an energy level of 4.5 eV, and the third hole injection layer 323 thereof may have an energy level of 5.0 eV.

The hole injection layer 320 may aid in the transport of holes generated from the first electrode 310, and may prevent electrons from the second electrode 350 from being moved to the first electrode 310. That is, holes from the first electrode 310 may be injected, and the hole injection layer 320 may aid the injected holes to be smoothly moved to the emission layer 330, and may prevent electrons from being moved to the first electrode 310.

As described above, as the hole injection layer 320 may be formed in a multilayer structure, by reducing an energy barrier of the layer, e.g., the first hole injection layer 321, of the multilayer structure closest to the first electrode 310 and gradually increasing the energy barrier from the closest hole injection layer, e.g., the first hole injection layer 321, to the farthest electron injection layer, e.g., the third hole injection layer 323, from the first electrode 310, the holes injected from the first electrode 310 may be gradually moved to the emission layer 330 through the respective layers of the multilayer hole injection layer 320.

The emission layer 330 may combine the holes and electrons injected from the first electrode 310 and the second electrode 350 to generate excitons. When an exciton changes from an excited state to a ground state, light may be emitted.

The electron injection layer 340 may transport electrons generated by the first electrode 310. The electron injection layer 340 may prevent holes generated by the second electrode 350 from being moved to the first electrode 310.

The second electrode 350 may be an electrode for supplying electrons. The second electrode 350 may be a transparent electrode or a reflective electrode. In some embodiments in which the second electrode 350 is employed as a transparent electrode, the second electrode 350 may include, e.g., Li, Ca, LiF/Ca, LiF/Al, Al, Ag, Mg, or a compound thereof. In such embodiments, an ITO, IZO, ZnO, or $In_2O_3$ layer may be formed thereon. In some embodiments in which the second electrode 350 is employed as a reflective electrode, the second electrode 350 may include, e.g., Ag, Mg, Al, Pt, Pd, Au, Ni, Nd, Ir, Cr, or a compound thereof.

Figure 5A:
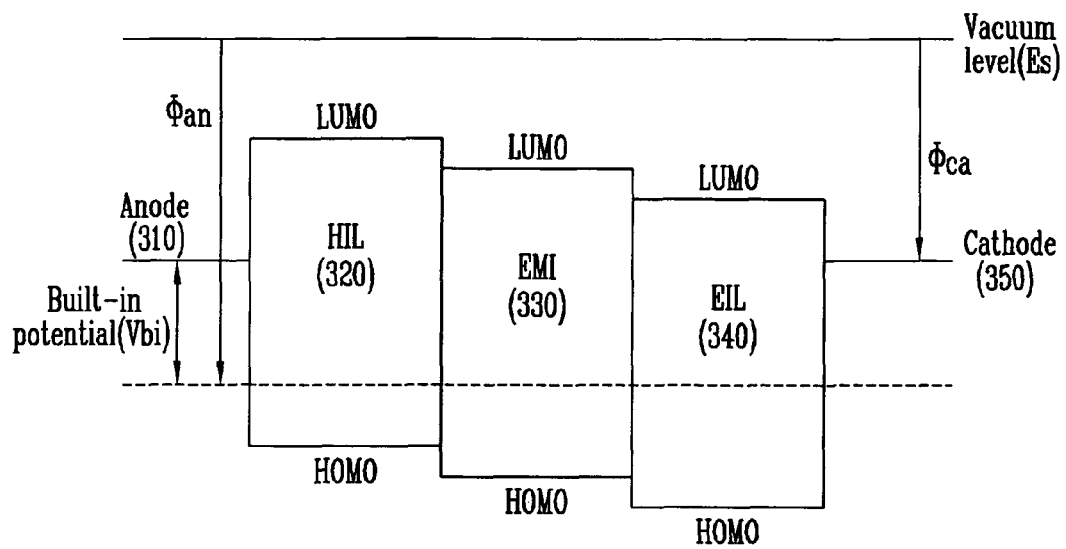
FIG. 5A and FIG. 5B illustrate energy diagrams of the OLED of FIG. 4.
Figure 5B:
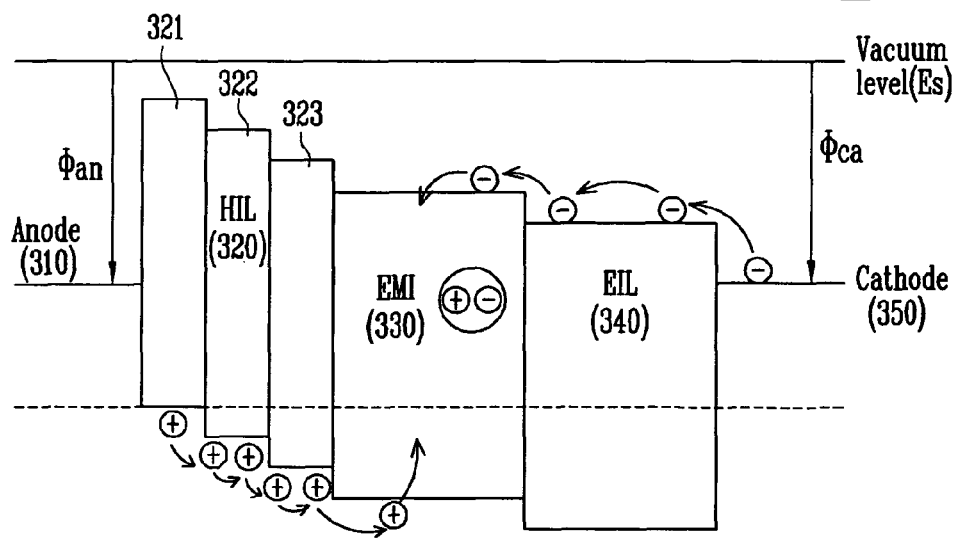

FIG. 5A and FIG. 5B illustrate energy diagrams of the OLED 30 of FIG. 4.

Electrons and holes are indicated as "−" and "+", respectively. Φan and Φca indicate work function of the first electrode and the second electrode, respectively. HOMO and LUMO correspond to Highest Occupied Molecular Orbital and Lowest Unoccupied Molecular Orbital, respectively.

Referring to FIG. 5A and FIG. 5B, in the OLED 30, when a voltage is applied to the first electrode (anode) 310 and the second electrode (cathode) 350, holes and electrons from the first electrode 310 and the second electrode 350 are injected into the emission layer (EML) 330, and light may be generated.

As described above, in some embodiments, the work function of the first electrode 310 may be the same and/or substantially the same, e.g., within about 0.5 eV, as that of the second electrode 350, thereby structurally removing and/or minimizing a built-in potential due to a difference between the work function of the first and second electrodes 310 and 350.

Further, in some embodiments in which the hole injection layer (HIL) 320, interposed between the emission layer 330 and the first electrode 310, is a multilayer structure including the first hole injection layer 321, the second hole injection layer 322, and the third hole injection layer 323, an HOMO level may be gradually increased from the first electrode 310 to the emission layer 330. Accordingly, the holes injected from the first electrode 310 may be easily moved to the emission layer 330.

Accordingly, in some embodiments in which the first and the second electrodes 310, 350 have a same or substantially same work function, by providing the hole injection layer 320 as a multilayer structure, a built-in potential Vbi between the first electrode 310 and the hole injection layer 320 may be compensated. More particularly, e.g., the hole injection layer 320 may be formed as a multilayer to reduce an energy barrier, namely, the built-in potential Vbi occurring between the first electrode 310 and the first hole injection layer 321, which may lead to a reduction in power consumption of the OLED 30.

Figure 6A:
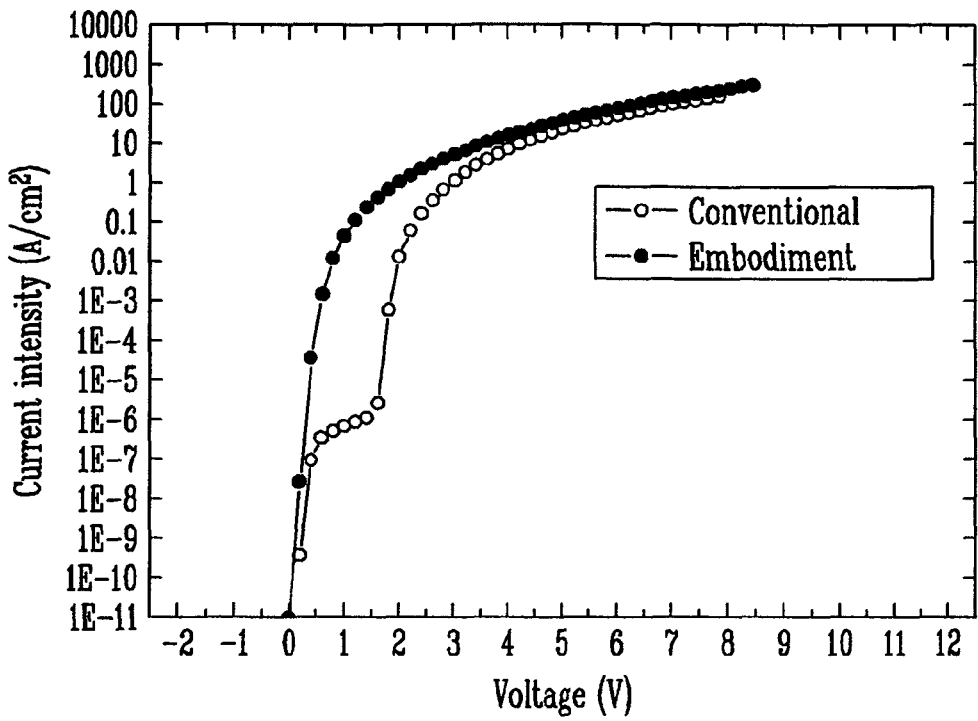
FIG. 6A illustrates a graph of a relationship between current intensity and voltage of the OLED of FIG. 4.
Figure 6B:
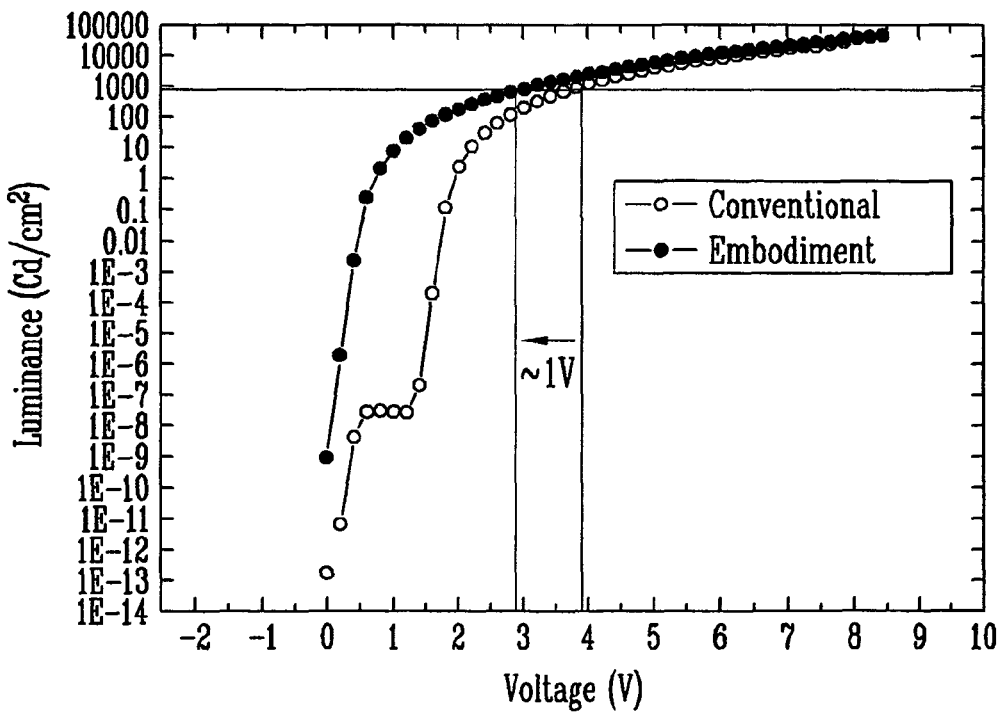
FIG. 6B illustrates a graph of a relationship between luminance and voltage of the OLED of FIG. 4.

FIG. 6A illustrates a graph of a relationship between current intensity and voltage of the OLED 30 of FIG. 4. FIG. 6B illustrates a graph of a relationship between luminance and voltage of the OLED 30 of FIG. 4. In the graphs of FIGS. 6A and 6B, the conventional case corresponds to a conventional OLED including first and second electrodes that have different work functions and/or does not include an hole injection layer having a multilayer structure.

Referring to FIG. 6A and FIG. 6B, an X axis of a graph of FIG. 6A indicates a voltage (V) and a Y axis thereof indicates a current intensity (J:A/$cm^2$). Further, an X axis of a graph of FIG. 6B indicates a voltage (V) and a Y axis thereof indicates luminance (L:cd/$m^2$).

Referring to FIG. 6A and FIG. 6B, in a conventional OLED, a built-in potential is about 2.04 V, and a built-in potential according to an embodiment of the present invention is about 0.34 V.

According to the graph of FIG. 6A, a current intensity of 1 E-5.5 (A/$cm^2$) may be obtained by the conventional OLED when a voltage of about 1.6 V is applied, whereas a current intensity of 1 E-5.5 (A/$cm^2$) may be obtained in the exemplary OLED 30 when a voltage of about 0.1 V is applied. According to the graph of FIG. 6B, a luminance of about 800 (cd/$cm^2$) may be obtained by the conventional OLED when a voltage of about 3.8 V is applied, whereas a luminance of about 800 (cd/$cm^2$) may be obtained by the exemplary OLED 30 when a voltage of about 2.8 V is applied.

Thus, as shown in FIG. 6A, the exemplary OLED 30 according to an embodiment of the invention may have a lower driving voltage, i.e., reduced by about 1.3 V, relative to the conventional OLED in order to obtain a current intensity of about 1 E-5.5 (A/$cm^2$). Further, as shown in FIG. 3B, the exemplary OLED 30 according to an embodiment may have a lower driving voltage, i.e., reduced by about 1.0 V, relative to the conventional OLED in order to obtain a luminance of about 800 (cd/$cm^2$).

Accordingly, under same or similar conditions, e.g., same voltage applied thereto, embodiments of the invention may provide an OLED, e.g., 20, 30, having improved current intensity and/or luminance relative to a conventional OLED.

Figure 7:
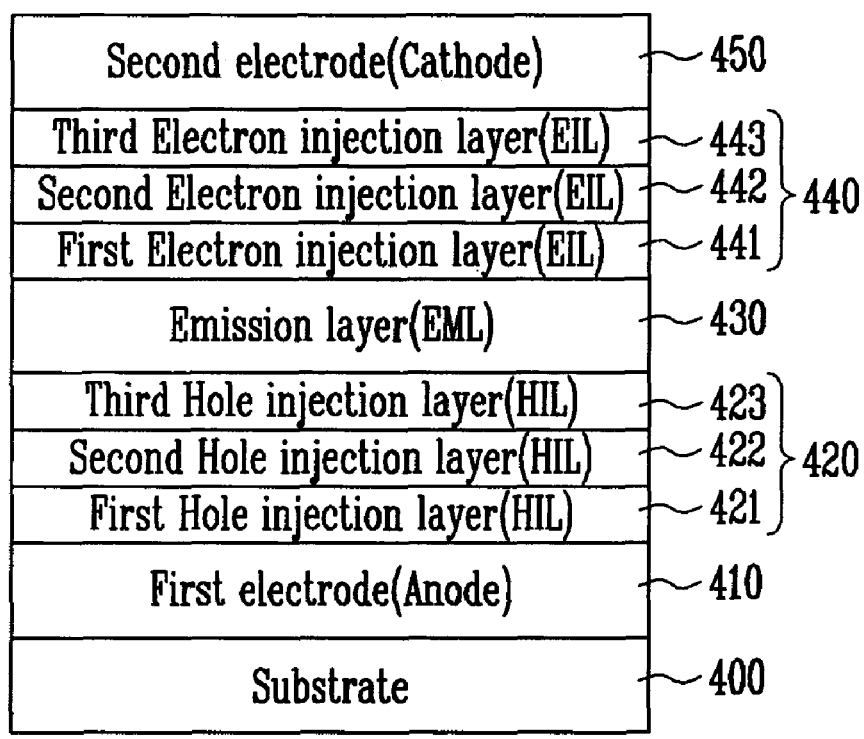
FIG. 7 illustrates a cross-sectional view of an OLED according to a third exemplary embodiment.

FIG. 7 illustrates a cross-sectional view of an OLED 40 according to a third exemplary embodiment. In general, only differences between the exemplary OLED 40 of FIG. 7 and the exemplary OLEDs 20, 30 of FIGS. 1 and 4 will be described below.

With reference to FIG. 7, the OLED 40 may include a first electrode (anode) 410, a hole injection layer (HIL) 420, an emission layer (EML) 430, an electron injection layer (EIL) 440, and a second electrode (cathode) 450. The first electrode 410 may be formed on a substrate 400 on which a thin film transistor is formed and may be electrically connected to the thin film transistor. The hole injection layer 420 may be formed on the first electrode 410. The emission layer 430 may be formed on the hole injection layer 420. The electron injection layer 440 may be formed on the emission layer 430. The second electrode 450 may be formed on the electron injection layer 440.

In some embodiments, a hole transport layer (not shown) for increasing a mobility degree of holes may be formed between the first electrode 410 and the hole injection layer 420. In some embodiments, an electron transport layer (not shown) for increasing a mobility degree of electrons may be formed between the second electrode 450 and the electron injection layer 440.

In some embodiments of the invention, in order to eliminate and/or reduce the built-in potential, the first electrode 410 and the second electrode 450 may be formed to have the same or similar work function. More particularly, in some embodiments, the built-in potential generated due to a difference between work function of the first electrode 410 and the second electrode 450 may be reduced and/or eliminated in order to reduce power consumption for driving the OLED 40, with the result that an emission layer 430 having improved emission efficiency may be provided.

Referring to FIG. 7, the exemplary OLED 40 substantially corresponds to a combination of the exemplary OLED 20 illustrated in FIG. 1 and the exemplary OLED 30 illustrated in FIG. 4. That is, the exemplary OLED 40 includes a multilayer structure for each of the hole injection layer 420 and the electron injection layer 440.

More particularly, e.g., the hole injection layer 420 may include a first hole injection layer 421, a second hole injection layer 422, and a third hole injection layer 423. The electron injection layer 440 may include a first electron injection layer 441, a second electron injection layer 442, and a third electron injection layer 443.

The layer, e.g., the first hole injection layer 421, of the hole injection layer 420 closest to the first electrode 410 may reduce an energy barrier at a border between the hole injection layer 420 and the first electrode 410, while the multilayer structure of the hole injection layer 420 may gradually increase a difference between LUMO energy levels of the first electrode 410 and the emission layer 430. As a result, a transport performance of electrons may be improved and a driving voltage may be reduced.

Referring still to FIG. 7, a layer, e.g., the third electron injection layer 443, of the hole injection layer 440 closest to the second electrode 410 may reduce an energy barrier at a border between the third electron injection layer 443 and the second electrode 410, while the multilayer structure of the electron injection layer 440 may gradually reduce a difference between LUMO energy levels of the second electrode 450 and the emission layer 430. As a result, a transport performance of holes may be improved and a driving voltage may be reduced.

Accordingly, in some embodiments in which the first and the second electrodes 410, 450 have a same or substantially same work function, by providing the hole injection layer 420 and the electron injection layer 440 as multilayer structures, a built-in potential Vbi between the first electrode 410 and the hole injection layer 420 may be compensated.

In some embodiments, an HOMO energy level of the first electron hole injection layer 421 closest to the first electrode 410 may be higher than that of the second electrode 450, an HOMO energy level of the second hole injection layer 422 between the first hole injection layer 421 and the third hole injection layer 423 may be higher than that of the first hole injection layer 421, and an HOMO energy level of the third hole injection layer 423 farthest from the second hole injection layer 422 may be higher than that of the second hole injection layer 422. Accordingly, some embodiments of the invention may enable holes injected from the first electrode 410 to be easily moved to the emission layer 430 at a relatively low voltage through the hole injection layer 420 having a multilayer structure.

An LUMO energy level of the third electron injection layer 443 closest to the second electrode 450 may be lower than that of the second electrode 450, an LUMO energy level of the second electron injection layer 442 between the third electron injection layer 443 and the first electron injection layer 441 may be lower than that of the third electron injection layer 443, and an LUMO energy level of the first electron injection layer 441 farthest from the second electrode 450 may be lower than that of the second electron injection layer 442. Accordingly, some embodiments of the invention may enable electrons injected from the second electrode 250 to be relatively easily moved to the emission layer 430 at a relatively low voltage through the electron injection layer 440 having a multilayer structure.

As described above, as the hole injection layer 420 may be formed in a multilayer structure, by reducing an energy barrier of the layer, e.g., the first hole injection layer 421, of the multilayer structure closest to the first electrode 410 and gradually increasing the energy barrier from the closest hole injection layer, e.g., the first hole injection layer 421, to the farthest electron injection layer, e.g., the third hole injection layer 423, from the first electrode 410, the holes injected from the first electrode 410 may be gradually moved to the emission layer 430 through the respective layers of the multilayer hole injection layer 420.

As mentioned above, as the electron injection layer 440 may be formed in a multilayer structure, by reducing an energy barrier of the layer, e.g., the third electron injection layer 443, of the multilayer structure closest to the second electrode 450 and gradually increasing the energy barrier from the closest electron injection layer, e.g., the third electron injection layer 443, to the farthest electron injection layer, e.g., the first electron injection layer 441, from the second electrode 450, the electrons injected from the second electrode 450 may be gradually moved to the emission layer 430 through the respective layers of the multilayer electron injection layer 440.

The emission layer 430 may combine the holes and electrons injected from the first electrode 410 and the second electrode 450 to generate excitons. When an exciton changes from an excited state to a ground state, light may be emitted.

Figure 8A:
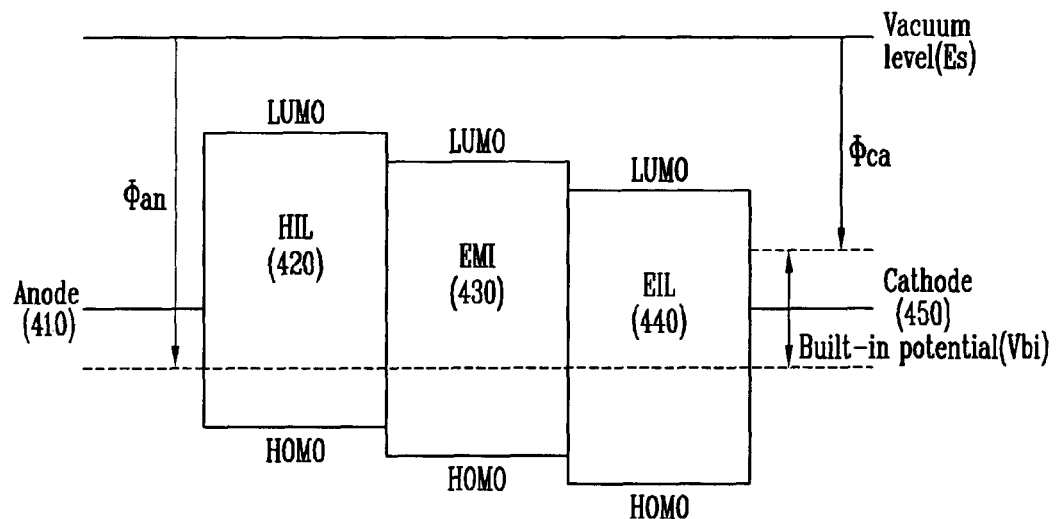
FIG. 8A and FIG. 8B illustrate energy diagrams of the OLED of FIG. 7.
Figure 8B:
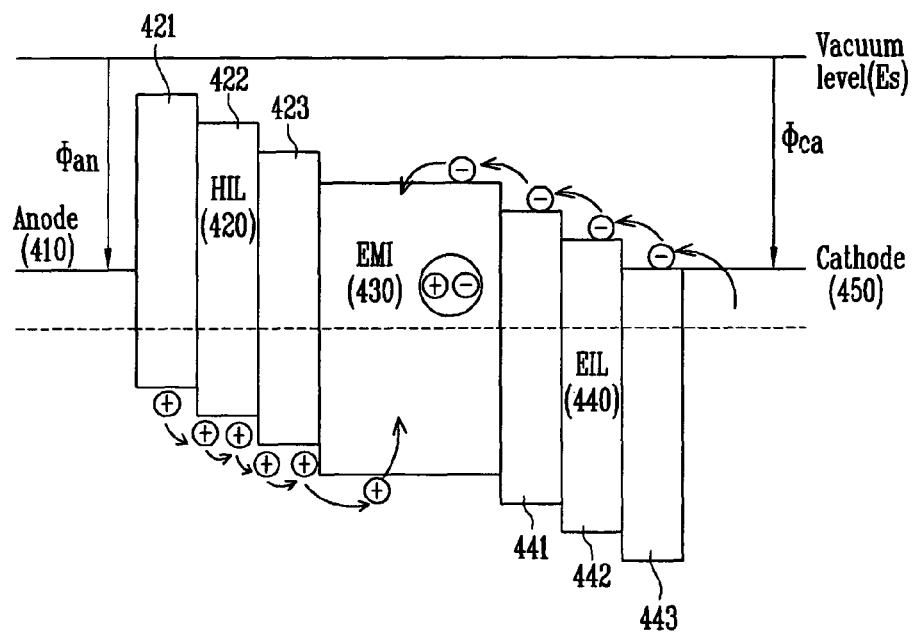

FIG. 8A and FIG. 8B illustrate energy diagrams of the OLED 40 of FIG. 7.

Electrons and holes are indicated as "−" and "+", respectively. Φan and Φca indicate work function of the first electrode and the second electrode, respectively. HOMO and LUMO correspond to Highest Occupied Molecular Orbital and Lowest Unoccupied Molecular Orbital, respectively.

Referring to FIG. 8A and FIG. 8B, in the OLED, when a voltage is applied to the first electrode (anode) 410 and the second electrode (cathode) 450, holes and electrons from the first electrode 410 and the second electrode 450 may be injected into the emission layer (EML) 430, so that light may be generated.

As described above, in some embodiments, the work function of the first electrode 410 may be the same and/or substantially the same, e.g., within about 0.5 eV, as that of the second electrode 450, thereby structurally removing and/or minimizing a built-in potential due to a difference between the work function of the first and second electrodes 410 and 450.

Further, in some embodiments in which the hole injection layer (HIL) 420, interposed between the emission layer 430 and the first electrode 410, is a multilayer structure including the first hole injection layer 421, the second hole injection layer 422, and the third hole injection layer 423, an HOMO level may be gradually increased from the first electrode 310 to the emission layer 430. Accordingly, the holes injected from the first electrode 410 may be easily moved to the emission layer 430.

Furthermore, as the electron injection layer (EIL) 440 interposed between the emission layer 430 and the second electrode 450 may be a multilayer structure including the first electron injection layer 441, the second electron injection layer 442, and the third electron injection layer 443, an LUMO level may be gradually reduced from the second electrode 450 to the emission layer 430. Accordingly, the electrons injected from the second electrode 450 may be easily moved to the emission layer 430.

Accordingly, by forming the electron injection layer 440 as a multilayer, in some embodiments in which the second electrode 450 has a same or similar work function as that of the first electrode 410, a built-in potential Vbi between the second electrode 450 and the electron injection layer 440 may be compensated. As explained above, the electron injection layer 440 may be formed with a multilayer to reduce an energy barrier, namely, the built-in potential Vbi occurring between the second electrode 450 and the third electron injection layer 443, which may lead to a reduction in power consumption of the OLED 40.

Further, in some embodiments in which the first and second electrodes 410, 450 have a same or substantially same work function, by providing the hole injection layer 420 as a multilayer structure, a built-in potential Vbi between the first electrode 410 and the hole injection layer 420 may be compensated. More particularly, e.g., the hole injection layer 420 may be formed as a multilayer to reduce an energy barrier, namely, the built-in potential Vbi occurring between the first electrode 410 and the first hole injection layer 421, which may lead to a reduction in power consumption of the OLED 40.

Figure 9A:
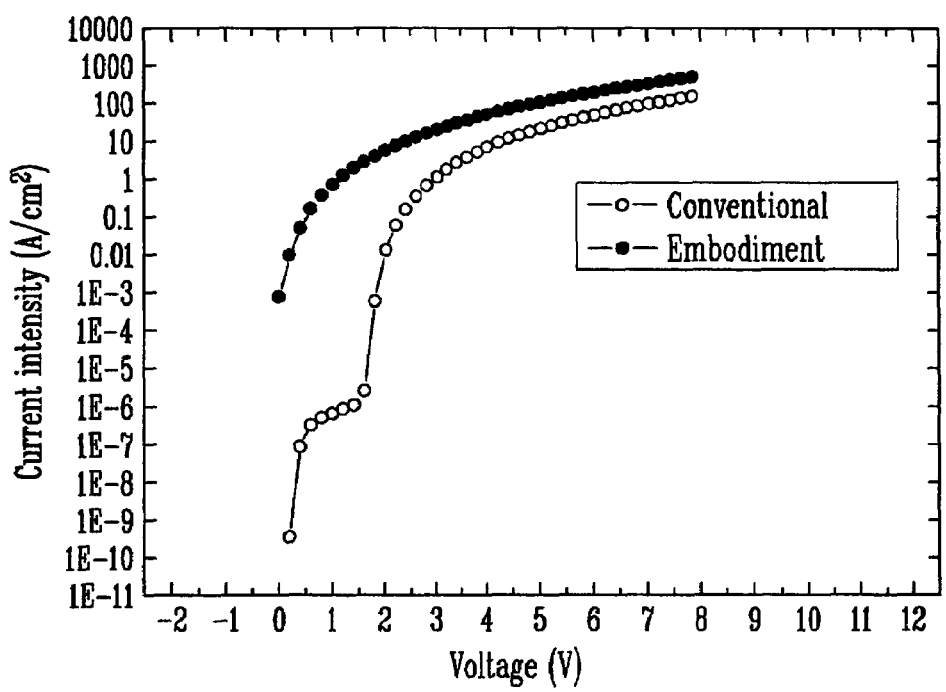
FIG. 9A illustrates a graph of a relationship between current intensity and voltage of the OLED of FIG. 7.
Figure 9B:
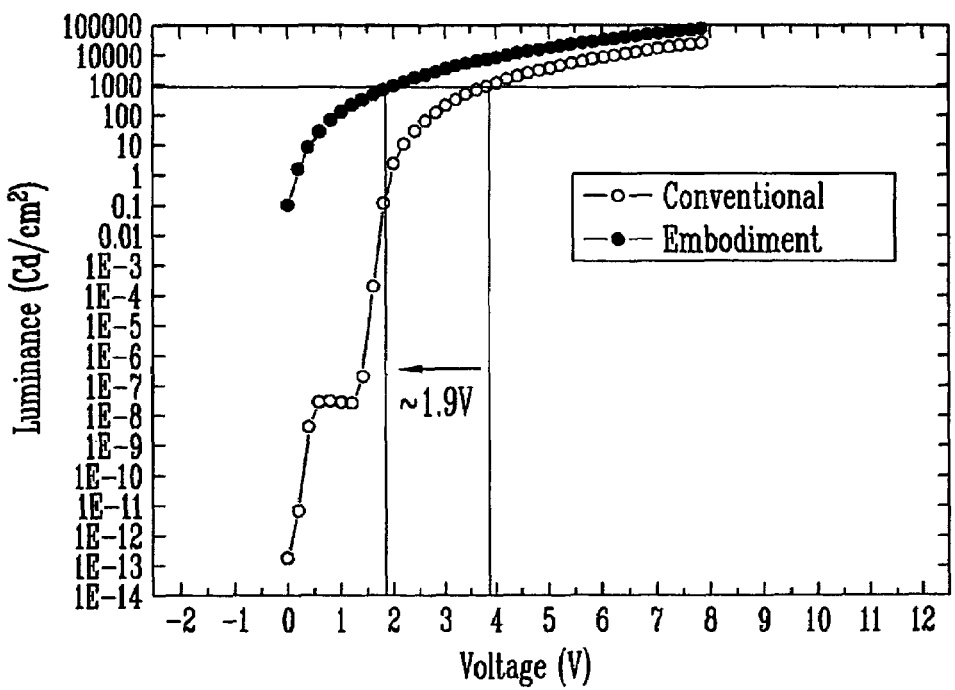
FIG. 9B illustrates a graph of a relationship between luminance and voltage of the OLED of FIG. 7.

FIG. 9A illustrates a graph of a relationship between current intensity and voltage of the OLED 40 of FIG. 7. FIG. 9B illustrates a graph of a relationship between luminance and voltage of the OLED 40 of FIG. 7.

Referring to FIG. 9A and FIG. 9B, an X axis of a graph of FIG. 9A indicates a voltage (V) and a Y axis thereof indicates a current intensity (J:A/cm$^2$). Further, an X axis of a graph of FIG. 9B indicates a voltage (V) and a Y axis thereof indicates luminance (L: cd/m$^2$).

Referring to FIG. 9A and FIG. 9B, in a conventional OLED, a built-in potential is about 2.04 V, and a built-in potential according to an embodiment of the present invention is about 0.14 V.

According to the graph of FIG. 9A, a current intensity of 0.05 (A/cm$^2$) may be obtained by a conventional OLED when a voltage of about 2.2 V is applied, whereas a current intensity of 0.05 (A/cm$^2$) may be obtained in the exemplary OLED 40 when a voltage of about 0.4 V is applied. According to the graph of FIG. 9B, a luminance of about 800 (cd/cm$^2$) may be obtained by a conventional OLED when a voltage of about 3.8 V is applied, whereas a luminance of about 800 (cd/cm$^2$) may be obtained by the exemplary OLED 40 when a voltage of about 1.9 V is applied.

Thus, as shown in FIG. 9A, the exemplary OLED 40 according to an embodiment of the invention may have a lower driving voltage, i.e., reduced by about 1.8 V, relative to the conventional OLED in order to obtain a current intensity of about 0.55 (A/cm$^2$). Further, as shown in FIG. 9B, the exemplary OLED 40 according to an embodiment may have a lower driving voltage, i.e., reduced by about 1.9 V, relative to the conventional OLED in order to obtain a luminance of about 800 (cd/cm$^2$).

Accordingly, under same or similar conditions, e.g., same voltage applied thereto, embodiments of the invention may provide an OLED, e.g., 20, 30, 40, having improved current intensity and/or luminance relative to a conventional OLED.

Embodiments of the invention may control and/or set a work function of the first electrode and the second electrode to structurally remove or minimize a built-in potential. Embodiments may enable a driving voltage to be reduced, and may improve emission efficiency in order to enhance characteristics of an OLED.

In embodiments, at least one of a hole injection layer and an electron injection layer may be formed as a multilayer to gradually increase or reduce an energy barrier so as to easily move electrons and holes to an emission layer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, including at least one organic light emitting diode (OLED) comprising:
    a first electrode;
    a hole injection layer on the first electrode;
    an emission layer on the hole injection layer;
    an electron injection layer on the emission layer; and
    a second electrode on the electron injection layer,
    wherein an absolute value of a difference between a work function of the first electrode and a work function of the second electrode is less than 0.5 eV, and the first electrode and the second electrode include materials different from each other;
    wherein the hole injection layer is an at least three-layer multilayer that includes a first hole injection layer, a second hole injection layer, and a third hole injection layer, wherein:
        an energy level of the second hole injection layer is less than an energy level of the third hole injection layer,
        an energy level of the first hole injection layer is less than the energy level of the second hole injection layer,
        the first hole injection layer is closest to the first electrode of the first, second, and third hole injection layers, and
        the third hole injection layer is farthest from the first electrode of the first, second, and third hole injection layers; and
    wherein the electron injection layer is an at least three-layer multilayer that includes a first electron injection layer, a second electron injection layer, and a third electron injection layer, wherein:
        an energy level of the second electron injection layer is less than an energy level of the third electron injection layer, an energy level of the first electron injection layer is less than the energy level of the second electron injection layer, the first electron injection layer is farthest from the second electrode of the first, second, and third electron injection layers, and the third electron injection layer is closest to the second electrode of the first, second, and third electron injection layers.

2. The organic light emitting diode display as claimed in claim 1, wherein the hole injection layer has a HOMO (Highest Occupied Molecular Orbital) energy level between a HOMO energy level of the first electrode and a HOMO energy level of the emission layer.

3. The organic light emitting diode display as claimed in claim 1, wherein the electron injection layer has an LUMO (Lowest Unoccupied Molecular Orbital) energy level between an LUMO energy level of the second electrode and an LUMO energy level of emission layer.

4. The organic light emitting diode display as claimed in claim 1, wherein the hole injection layer has a HOMO energy level between a HOMO energy level of the first electrode and a HOMO energy level of the emission layer, and the electron injection layer has an LUMO energy level between an LUMO energy level of the second electrode and an LUMO energy level of the emission layer.

5. The organic light emitting diode display as claimed in claim 1, further comprising a hole transport layer formed between the first electrode and the hole injection layer.

6. The organic light emitting diode display as claimed in claim 1, further comprising an electron transport layer formed between the second electrode and the electron injection layer.

7. The organic light emitting diode display as claimed in claim 1, wherein the work function of the first electrode is different from the work function of the second electrode.

8. An organic light emitting diode (OLED), comprising:
a first electrode;
a hole injection layer on the first electrode;
an emission layer on the hole injection layer;
an electron injection layer on the emission layer; and
a second electrode on the electron injection layer,
wherein an absolute value of a difference between a work function of the first electrode and a work function of the second electrode is less than 0.5 eV, and the first electrode and the second electrode include materials different from each other;
wherein the hole injection layer is an at least three-layer multilayer that includes a first hole injection layer, a second hole injection layer, and a third hole injection layer, wherein:
an energy level of the second hole injection layer is less than an energy level of the third hole injection layer,
an energy level of the first hole injection layer is less than the energy level of the second hole injection layer,
the first hole injection layer is closest to the first electrode of the first, second, and third hole injection layers, and
the third hole injection layer is farthest from the first electrode of the first, second, and third hole injection layers; and
wherein the electron injection layer is an at least three-layer multilayer that includes a first electron injection layer, a second electron injection layer, and a third electron injection layer, wherein:
an energy level of the second electron injection layer is less than an energy level of the third electron injection layer,
an energy level of the first electron injection layer is less than the energy level of the second electron injection layer,
the first electron injection layer is farthest from the second electrode of the first, second, and third electron injection layers, and
the third electron injection layer is closest to the second electrode of the first, second, and third electron injection layers.

9. The OLED as claimed in claim 8, wherein:
the hole injection layer has a HOMO (Highest Occupied Molecular Orbital) energy level between a HOMO energy level of the first electrode and a HOMO energy level of the emission layer, and
the electron injection layer has an LUMO (Lowest Unoccupied Molecular Orbital) energy level between an LUMO energy level of the second electrode and an LUMO energy level of emission layer.

10. An organic light emitting diode (OLED), comprising:
a first electrode;
a hole injection layer on the first electrode;
an emission layer on the hole injection layer;
an electron injection layer on the emission layer;
a second electrode on the electron injection layer; and
a hole transport layer arranged between the first electrode and the hole injection layer and/or an electron transport layer arranged between the second electrode and the electron injection layer,
wherein: an absolute value of a difference between a work function of the first electrode and a work function of the second electrode is less than 0.5 eV, and the first electrode and the second electrode include materials different from each other;
wherein the hole injection layer is an at least three-layer multilayer that includes a first hole injection layer, a second hole injection layer, and a third hole injection layer, wherein:
an energy level of the second hole injection layer is less than an energy level of the third hole injection layer,
an energy level of the first hole injection layer is less than the energy level of the second hole injection layer,
the first hole injection layer is the closest hole injection layer to the first electrode of the first, second, and third hole injection layers, and
the third hole injection layer is the farthest hole injection layer from the first electrode of the first, second, and third hole injection layers; and
wherein the electron injection layer is an at least three-layer multilayer that includes a first electron injection layer, a second electron injection layer, and a third electron injection layer, wherein:
an energy level of the second electron injection layer is less than an energy level of the third electron injection layer,
an energy level of the first electron injection layer is less than the energy level of the second electron injection layer,
the first electron injection layer is farthest from the second electrode of the first, second, and third electron injection layers, and
the third electron injection layer is closest to the second electrode of the first, second, and third electron injection layers.

* * * * *

(12) SUPPLEMENTAL EXAMINATION CERTIFICATE

United States Patent
Park et al.

(10) Number: 8,319,420 F1
(45) Certificate Issued: Jan. 21, 2016

Control No.: 96/000,117　　　　　　　　　　　Filing Date: Dec. 1, 2015
Primary Examiner: Fred Ferris No substantial new question of patentability is raised in the request for supplemental examination. See the Reasons for Substantial New Question of Patentability Determination in the file of this proceeding.

(56) Items of Information

U.S. PATENT DOCUMENTS

| | | |
|---|---|---|
| 5701005 | 12/23/1997 | Nagayama et al |

FOREIGN PATENT DOCUMENTS

| | | |
|---|---|---|
| JP | 2006-107790 A | 04/2006 |
| KR | 10-0518420 B | 09/2005 |
| KR | 10-2005-0046624 A | 05/2005 |
| KR | 10-2006-0048920 A | 05/2006 |
| KR | 10-2005-0100569 A | 10/2005 |
| KR | 10-2005-0052302 A | 06/2005 |
| KR | 10-2005-0121595 A | 12/2005 |